(12) United States Patent
Lowrey et al.

(10) Patent No.: US 6,329,686 B1
(45) Date of Patent: Dec. 11, 2001

(54) METHOD OF FABRICATING CONDUCTIVE STRAPS TO INTERCONNECT CONTACTS TO CORRESPONDING DIGIT LINES BY EMPLOYING AN ANGLED SIDEWALL IMPLANT AND SEMICONDUCTOR DEVICES FABRICATED THEREBY

(75) Inventors: Tyler A. Lowrey, Sand Point; Shubneesh Batra, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/439,623

(22) Filed: Nov. 12, 1999

(51) Int. Cl.$^7$ ..................................... H01L 29/72
(52) U.S. Cl. ..................... 257/314; 257/315; 257/316; 257/324; 257/773; 438/201; 438/257; 438/262; 438/302; 438/525; 438/696
(58) Field of Search ................................. 257/314, 315, 257/316, 324, 773; 438/201, 257, 262, 302, 525, 696

(56) References Cited

U.S. PATENT DOCUMENTS

| | | |
|---|---|---|
| 5,300,463 | 4/1994 | Cathey et al. . |
| 5,615,089 | 3/1997 | Yoneda et al. . |
| 6,194,784 * | 2/2001 | Parat et al. ............................ 257/315 |

* cited by examiner

*Primary Examiner*—Edward Wojciechowicz
(74) *Attorney, Agent, or Firm*—TraskBritt, PC

(57) ABSTRACT

A method of interconnecting bit contacts to corresponding digit lines of a semiconductor memory device. The method is particularly useful for fabricating semiconductor memory devices having digit lines that are less than about 0.2 microns wide and spaced less than about 0.2 microns apart from one another. A mask, which shields portions of the digit lines of the semiconductor device, through which portions of the digit lines proximate the bit contacts are exposed, is disposed over the semiconductor device. The mask preferably includes elongated apertures alignable transversely to the digit lines. Dopant is directed toward the semiconductor device at a non-perpendicular angle to a plane of the semiconductor device. Thus, portions of the sidewall spacers of one side of each of the digit lines, sidewall spacers on the opposite sides of the digit lines, or the bit contacts may not be exposed to dopant. Doped oxide regions of the sidewall spacers may be removed with selectivity over undoped oxide regions or silicon nitride regions of the sidewall spacers. As the doped oxide regions are removed from the digit lines, a connect region of a conductive element of each of the digit lines is exposed. Conductive material may then be disposed adjacent the exposed connect region of the conductive element and in contact with the bit contact to establish an electrical link between the bit contact and its corresponding digit line. Semiconductor devices including such a conductive strap structure and, in particular, semiconductor devices which employ a conductive strap to interconnect a bit contact and a digit line having widths of less than about 0.2 microns and spaced less than about 0.2 microns apart from an adjacent digit line are also within the scope of the present invention.

58 Claims, 8 Drawing Sheets

METHOD OF FABRICATING CONDUCTIVE STRAPS TO INTERCONNECT CONTACTS TO CORRESPONDING DIGIT LINES BY EMPLOYING AN ANGLED SIDEWALL IMPLANT AND SEMICONDUCTOR DEVICES FABRICATED THEREBY

BACKGROUND OF THE INVENTION

1. Field of the Invention

The present invention relates to methods of electrically interconnecting the bit contacts of a semiconductor memory device and the corresponding digit lines of the semiconductor memory device. In particular, the present invention relates to a method of forming a conductive strap between a bit contact and its corresponding digit line. More particularly, the present invention relates to a method of forming such a conductive strap on a semiconductor device having adjacent conductive lines that are spaced less than about 0.2 microns apart. The present invention also relates to semiconductor devices including bit contacts operably linked to corresponding digit lines by means of such conductive straps.

2. Background of Related Art

Conventional semiconductor memory devices typically include an array of memory cells, each of which is in communication with a word line and a digit line. Due to the demand for semiconductor devices of ever-increasing density and ever-decreasing size, the semiconductor industry has sought ways to fabricate semiconductor devices having smaller, more compactly organized features. Thus, in semiconductor memory devices, the sizes of various features, as well as the spacing therebetween, have decreased. For example, the width of state of the art digit lines has decreased to about 0.2 microns or less. The spacing between adjacent digit lines has similarly decreased to about 0.2 microns or less.

Conventionally, photomask techniques, which typically employ visible to deep ultraviolet ("UV") wavelengths of light, have been used to fabricate the digit lines of semiconductor memory devices. The sizes of features of such photomasks are, however, limited by the wavelengths of electromagnetic radiation employed to define these photomasks. As a result, the sizes and spacing of features defined either directly or indirectly by such photomasks are similarly limited.

The art does not include a method by which semiconductor memory devices that include digit lines with widths of less than about 0.2 microns and digit line pitches of less than about 0.4 microns may be more efficiently fabricated. Moreover, the art does not teach a method of fabricating semiconductor memory devices having increased feature density and which employs conventional techniques and equipment.

SUMMARY OF THE INVENTION

The present invention includes a method of fabricating semiconductor-based memory devices, which are also referred to herein as semiconductor memory devices or as semiconductor devices, that include a semiconductor substrate with conductivity doped active areas extending thereacross in substantially mutually parallel relation to one another. Shallow trench isolation ("STI") areas are disposed between adjacent active areas so as to electrically isolate the adjacent active areas from each other. Word lines and, optionally, grounded gates are disposed over the semiconductor substrate, transversely relative to the word lines and grounded gates. The digit lines of the semiconductor memory device extend transversely over the word lines and grounded gates. Preferably, the digit lines are disposed substantially over the STI areas of the semiconductor memory device. Digit contacts, which are also referred to herein as bit contacts, are disposed between adjacent word lines and between adjacent digit lines that are oriented substantially perpendicular to the word lines. The digit lines have a width of less than about 0.2 microns. The digit lines, which are also referred to herein as bit lines or as column lines, preferably have a width as small as about 0.15 microns or less. The word lines and grounded gates of the semiconductor memory device also have widths of less than about 0.2 microns and may have widths as small as about 0.15 microns or less.

The method of the present invention may be performed on a semiconductor device including a semiconductor substrate with substantially mutually parallel active areas extending thereacross and separated by STI areas, mutually parallel word lines extending transversely relative to the active areas and STI areas, substantially mutually parallel digit lines oriented transversely relative to the word lines and positioned substantially above the STI areas, and an array of memory cells. Digit line contact areas are located on each active area between adjacent digit lines and between adjacent word lines. The word lines are located at a lower level than digit lines on the semiconductor device.

A digit contact plug is disposed in contact with a digit line contact area and extends through several layers of the semiconductor device to facilitate the formation of an electrical connection between the digit contact area and a corresponding digit line located several layers above the digit contact area. In semiconductor devices embodying teachings of the present invention, a strap extends between the digit contact plug to the corresponding digit line. Thus, a digit contact plug and a corresponding strap together facilitate electrical communication between a digit line contact area and a corresponding digit line.

In accordance with the digit contact plug-strap fabrication method of the present invention, columns of bit contact areas of the semiconductor device are exposed through a mask, while regions of the semiconductor memory device between adjacent rows of bit contacts are substantially shielded, or masked. For example, a mask, such as a photomask, may be disposed over the semiconductor device such that portions of the bit lines are exposed through apertures of the mask. Preferably, the mask has a striped appearance and includes a plurality of elongate apertures that are positionable over the desired digit contact areas, substantially parallel to the word lines and grounded gates, and transverse to the digit lines. Alternatively, the mask may shield substantially all of the features of the semiconductor memory device except for the regions of the digit lines proximate each of the digit contact areas and to which an electrical link with the proximate digit contact area will be established. As another alternative, the mask may have apertures that expose regions of the digit line side walls that are to be removed to facilitate the fabrication of a strap and, thus, the formation of an electrical connection between a digit contact plug and the digit line that corresponds thereto.

A dopant may be directed toward the semiconductor device at an angle non-perpendicular to a plane of the semiconductor device. Thus, while at least portions of a first sidewall oxide of the exposed regions of the digit lines will be doped, the digit lines will substantially shield a second sidewall oxide on the opposite side of the digit lines from the dopant. An oxide cap of regions of the digit lines exposed through the mask are also doped. Preferably, the dopant is selected to facilitate the removal of the exposed doped insulative regions of the semiconductor device with selectivity over the exposed undoped insulative regions of the semiconductor device. Arsenic and phosphorus are exemplary silicon oxide dopants that may be employed in accordance with the method of the present invention.

The exposed doped insulative regions of the semiconductor device may be removed by known processes, such as by employing a selective, or preferential, etchant. The etchant employed substantially removes doped oxide regions without significantly removing material of the undoped oxide regions exposed through the mask, other undoped oxide structures, or insulative structures of other materials, such as silicon nitride (e.g., the side walls or cap of word line therebelow, which can be fabricated from a silicon oxide or a silicon nitride). Preferably, as the doped oxide regions of a first sidewall of the digit lines are removed, the conductive element of each of the digit lines is exposed.

A quantity of conductive material, such as polysilicon, may be disposed over the bit contact adjacent to and in electrical communication with both the bit contact and the exposed conductive element of the corresponding digit line. Preferably, individual electrically isolated slugs of conductive material are disposed within the trenches, in contact with each of the bit contacts, and in contact with exposed regions of the adjacent digit lines. As the conductive material is disposed in contact with the exposed regions of the digit lines and their corresponding bit contacts and is, therefore, in electrical communication with both a bit contact and its corresponding digit line, the straps of conductive material facilitate electrical communication between the bit contacts and their corresponding digit lines. The conductive material may be blanket deposited over the semiconductor device, then removed from above the digit lines and word lines by known processes, such as by masking and etching techniques, in order to define conductive straps that are electrically isolated from one another.

Further fabrication or processing of the semiconductor device may then be performed by known processes.

Semiconductor memory devices including digit lines having widths of less than about 0.2 microns and spaced less than about 0.2 microns apart from one another and fabricated in accordance with the method of the present invention are also within the scope of the present invention. Preferably, the semiconductor memory devices of the present invention and semiconductor memory devices that are fabricated in accordance with the method of the present invention include digit lines having widths of less than about 0.2 microns and pitches of less than about 0.40 microns. Accordingly, adjacent digit lines are preferably spaced less than about 0.2 microns from one another. Preferably, the digit lines have widths of about 0.15 microns or less.

Other features and advantages of the present invention will become apparent to those of ordinary skill in the art through consideration of the ensuing description, the accompanying drawings, and the appended claims.

DETAILED DESCRIPTION OF THE INVENTION

Figure 1:
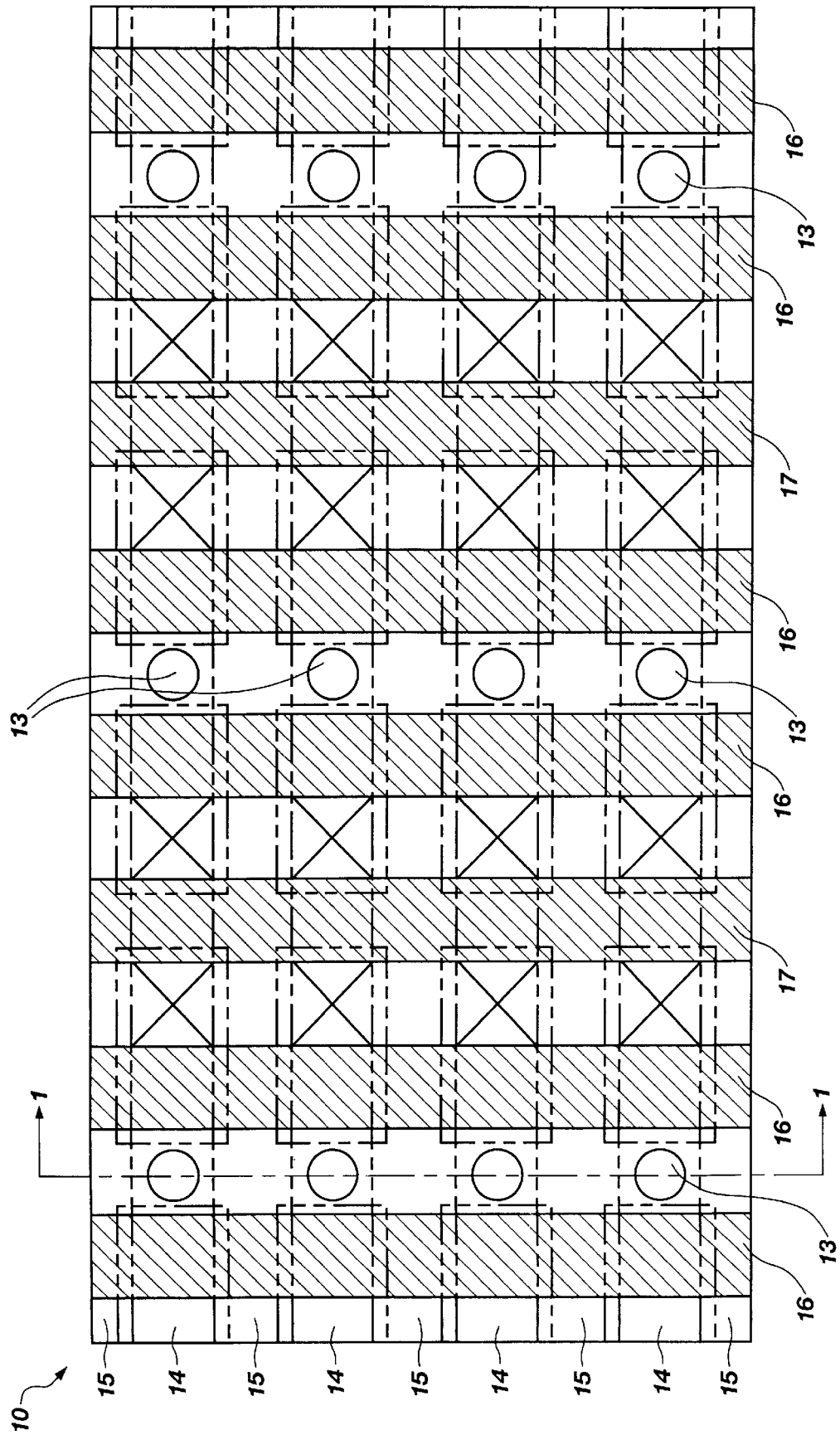
FIG. 1 is a schematic representation illustrating the architectural layout of a semiconductor memory device according to the present invention.
Figure 1A:
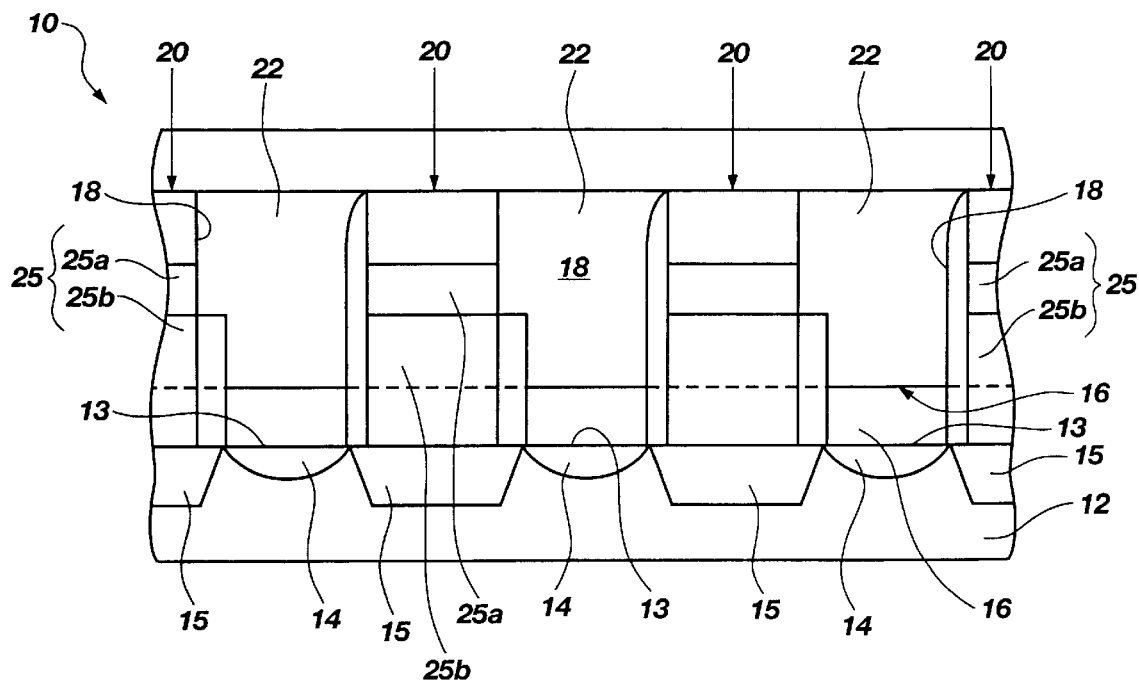
FIG. 1A is a cross-sectional representation taken along line 1—1 of FIG. 1 and depicting bit contacts that are electrically linked to their corresponding digit lines by means of conductive straps.

With reference to FIGS. 1 and 1A, a semiconductor memory device 10 according to the present invention includes a substrate 12 and active areas 14 formed in and extending across substrate 12, disposed between adjacent shallow trench isolation regions 15, which are also referred to herein as field oxide regions and which also extend across substrate 12. Word lines 16 and grounded gates 17 are disposed on substrate 12 and extend thereacross substantially transverse to active areas 14 and to shallow trench isolation regions 15 and substantially parallel to each other. Regions of active areas 14 that are located between adjacent word lines 16 are referred to as digit contact areas 13, or bit contacts. Substrate 12 preferably comprises a p-type semiconductor material, while active areas 14 preferably comprise n-doped regions of substrate 12. Semiconductor memory device 10 also includes digit lines 20 (FIG. 1A) extending thereacross in substantially mutually parallel relation to one another, in a direction substantially perpendicular to word lines 16 and grounded gates 17, and laterally offset relative to digit contact areas 13. Each digit contact area 13 communicates with its corresponding digit line 20 by means of an electrically conductive strap 22 (FIG. 1A), which is disposed within a digit contact opening 18 and in contact with the conductive element 25 (i.e., metal silicide 25a and/or polysilicon 25b) (FIG. 1A) of digit line 20.

Digit lines 20 preferably have a width of less than about 0.2 microns and, more preferably, of at most about 0.15 microns. Adjacent digit lines 20 are preferably spaced less than about 0.2 microns apart from one another and, more preferably, at most about 0.15 microns apart from one another. Thus, digit lines 20 preferably have a pitch of less than about 0.4 microns. Word lines 16 and grounded gates 17 also preferably each have a width of less than about 0.2 microns.

Although FIGS. 1 and 1A illustrate semiconductor memory device 10 as having elongate active areas 14 divided by grounded gates 17, semiconductor devices which include active areas distinct to a single cell thereof and which lack grounded gates, are also within the scope of the present invention.

A preferred embodiment of a method of fabricating a semiconductor memory device such as that illustrated in FIGS. 1 and 1A is depicted in and FIGS. 2–10.

Figure 2:
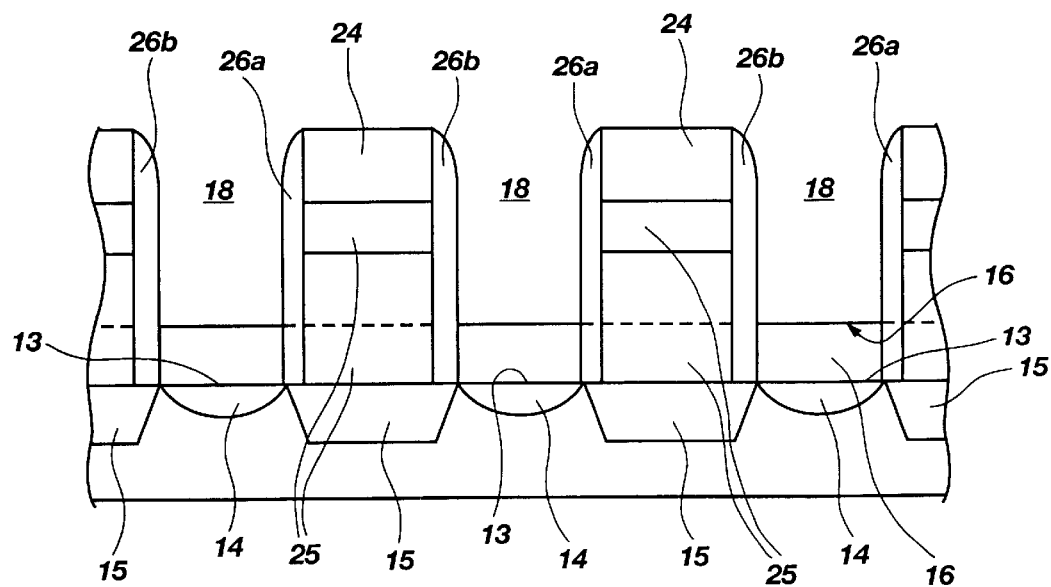
FIG. 2 is a cross-sectional representation of a semiconductor memory device including contacts exposed through trenches and digit lines that extend across the semiconductor device adjacent the trenches.

With reference to FIG. 2, the features of semiconductor memory device 10, such as active areas 14, digit contact areas 13, shallow trench isolation regions 15, word lines 16, grounded gates 17, digit contact openings 18, digit lines 20, etc., may be fabricated by known processes. Digit lines 20 may each include a conductive element 25 with an insulative cap 24 disposed over the top thereof and sidewall spacers 26a and 26b disposed adjacent both sides of conductive element 25. Cap 24 may include any suitable insulative material, such as a silicon oxide or silicon nitride. Preferably, at least one of sidewall spacers 26a and 26b comprises silicon oxide. The other of sidewall spacers 26a and 26b may comprise silicon nitride or silicon oxide. Digit contact areas 13 are preferably exposed through their corresponding digit contact openings 18.

During fabrication of digit lines 20, regions of word lines 16 and grounded gates 17 may be exposed between adjacent digit lines 20. Thus, when sidewall spacers 26a and 26b are fabricated on digit lines 20, an additional layer of the insulative materials from which sidewall spacers 26a and 26b are formed is disposed over the exposed regions of word lines 16 and grounded gates 17. Thus, the insulative layer over these exposed regions of word lines 16 and grounded gates 17 is thicker than the insulative layer over digit lines 20.

Figure 3:
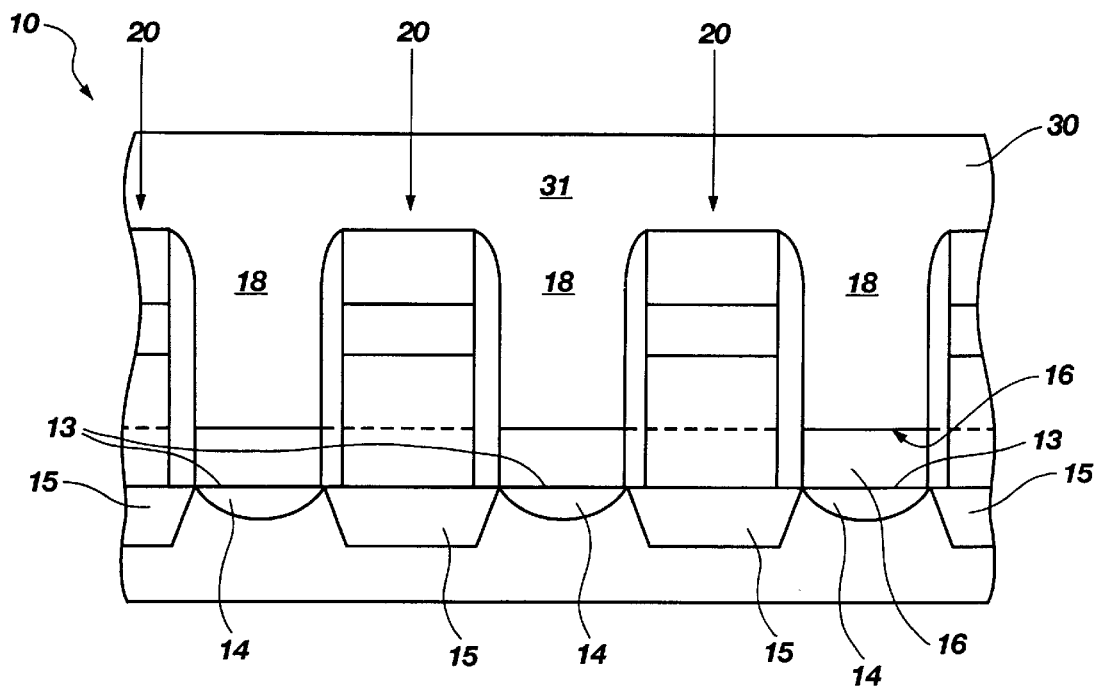
FIG. 3 is a cross-sectional representation of the semiconductor memory device of FIG. 2, depicting a mask having a striped configuration disposed over the digit lines so that the bit contacts are exposed through the mask.
Figure 3A:
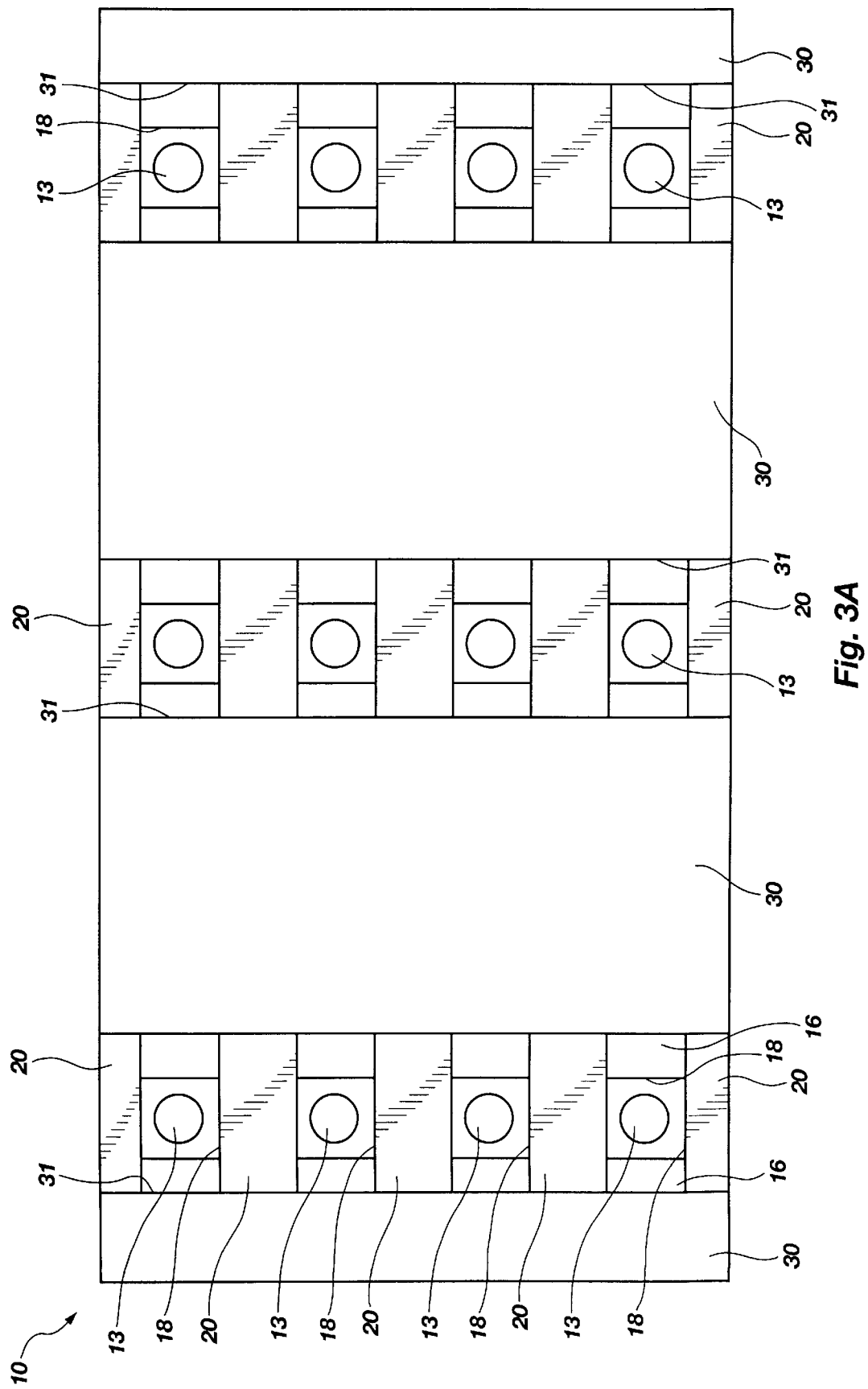
FIG. 3A is a schematic representation illustrating a top view of the semiconductor memory device depicted in FIG. 3.
Figure 5:
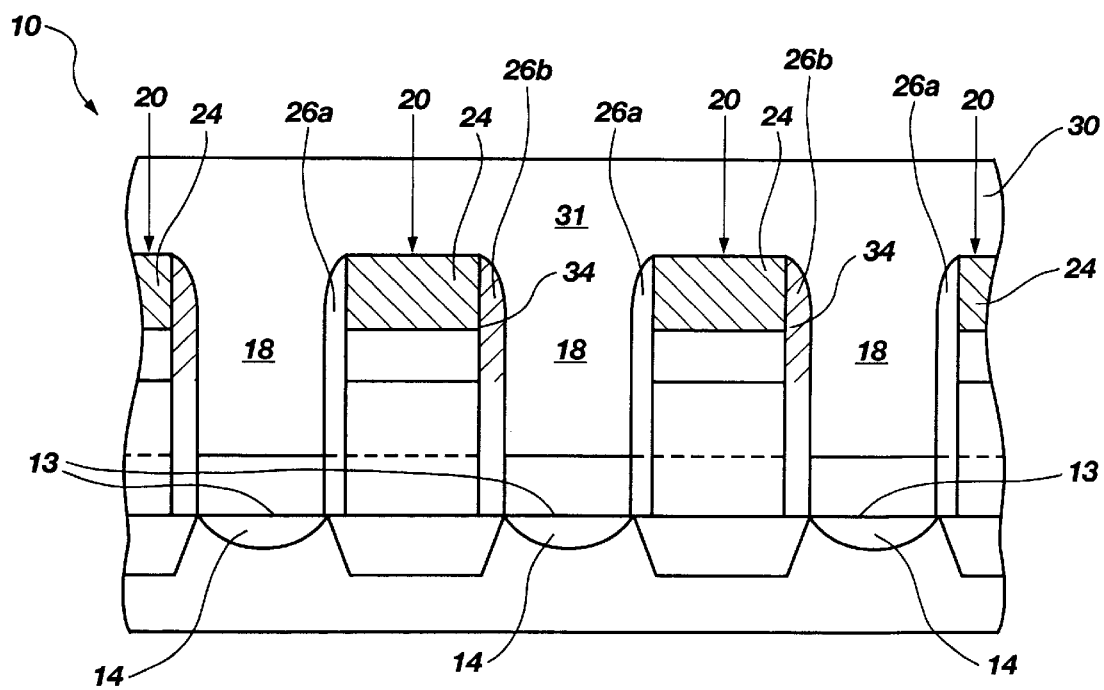
FIG. 5 is a cross-sectional representation of the semiconductor memory device of FIG. 4, illustrating the doped insulator regions as cross-hatched areas.

FIGS. 3 and 3A illustrate the disposal of a first mask 30 over a surface of semiconductor memory device 10. Mask 30 preferably has a striped configuration. Thus, mask 30 may include a plurality of substantially mutually parallel elongate apertures, which are preferably alignable over columns of digit contact areas 13 and substantially perpendicular to the direction in which digit lines 20 extend. Accordingly, the regions of digit lines 20 that are adjacent digit contact openings 18 are exposed through apertures 31 of mask 30, while the remainder of each digit line 20 is preferably shielded, or masked, by mask 30.

Mask 30 may be disposed on semiconductor memory device 10 by known processes, such as by disposing photoresist on semiconductor memory device 10, exposing selected regions of the photoresist, and developing the selected regions to define mask 30 and the apertures therethrough. The resist height can be configured to, along with a desired implant angle of the dopant, subsequently expose a selected area of a sidewall spacer 26a, 26b to the dopant.

Figure 4:
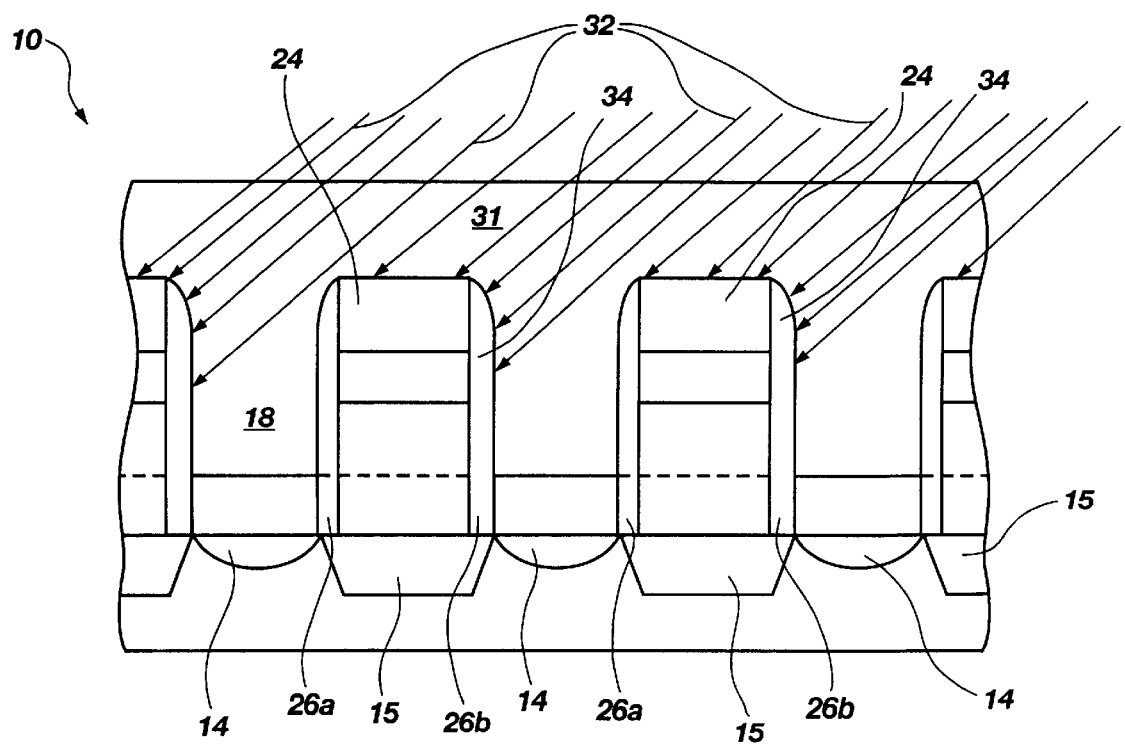
FIG. 4 is a cross-sectional representation of the semiconductor memory device of FIG. 3, illustrating the angled doping of regions of a sidewall spacer of the digit lines.

Turning now to FIG. 4, a dopant, depicted as arrows 32, is directed toward semiconductor memory device 10 at an angle that is non-perpendicular to a plane of semiconductor memory device 10 so as to implant some regions of semiconductor memory device exposed through mask 30. The angle at which dopant 32 is directed toward semiconductor memory device 10 preferably facilitates the doping of only one sidewall spacer 26b, while the other sidewall spacer 26a is shielded by digit line 20. Accordingly, selected regions 34 of sidewall spacers 26a or 26b on only one side of each digit line 20, as shown by the cross-hatching in FIG. 5, will be doped. Known implantation or doping processes and dopants may be employed to dope selected regions 34.

Figure 6:
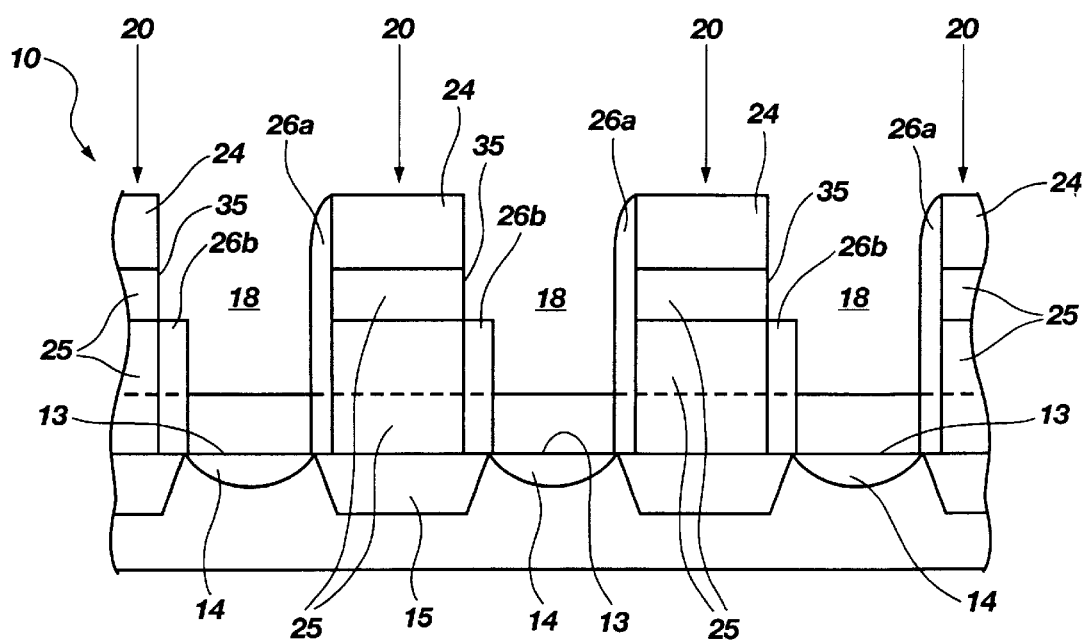
FIG. 6 is a cross-sectional representation of the semiconductor memory device of FIG. 5, depicting the removal of the selectively doped insulator regions from the semiconductor memory device and the consequent exposure of selected regions of the conductive elements of the digit lines.

Referring to FIG. 6, the selected regions 34 of sidewall spacer 26b, any doped silicon oxide regions of cap 24, and any other exposed doped silicon oxide regions are removed from semiconductor memory device 10. Selected regions 34 are preferably removed with selectivity over exposed, undoped regions of silicon oxide of digit lines 20 or other structures of semiconductor memory device 10, such as sidewall spacer 26a and undoped regions of sidewall spacer 26b and cap 24. Preferably, an etchant that removes doped silicon oxide with selectivity over undoped silicon oxide is employed. An exemplary etchant is disclosed in U.S. Pat. No. 5,300,463, which issued to David A. Cathey et al. on Apr. 5, 1994, the disclosure of which is hereby incorporated in its entirety by this reference. Doped selected regions 34 may be removed either before or after mask 30 has been removed from semiconductor memory device 10. Upon removing doped selected regions 34, conductive elements 25 of digit lines 20 are exposed through regions of at least sidewall spacer 26b, which regions are referred to herein as exposed regions 35 of digit lines 20.

Figure 7:
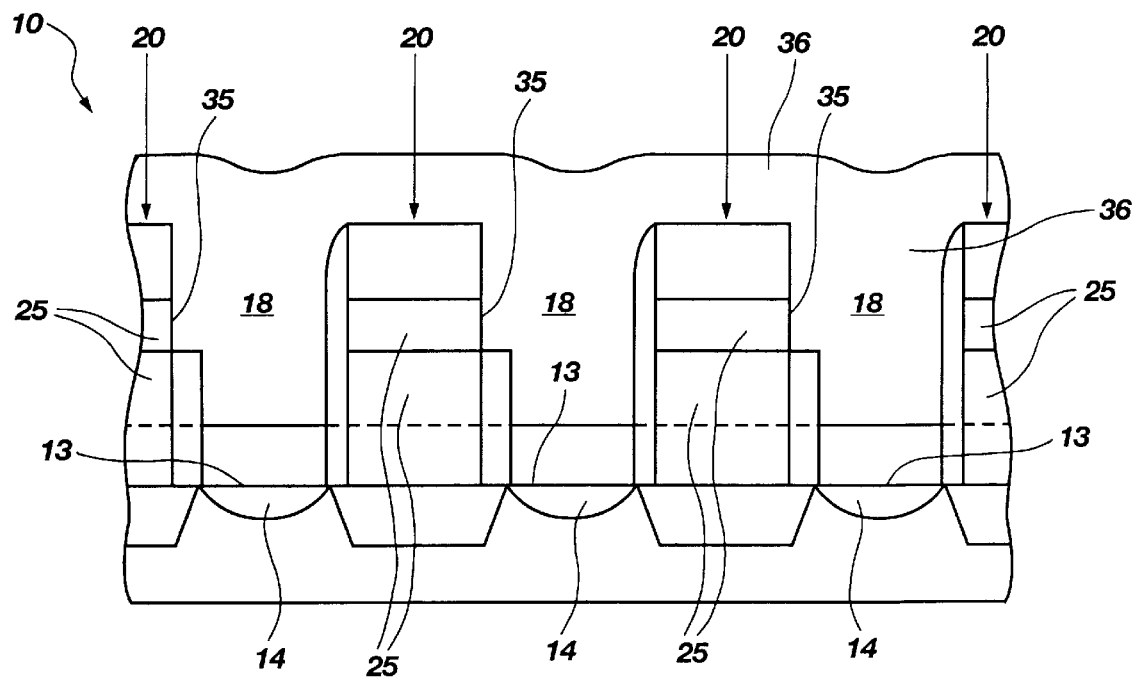
FIG. 7 is a cross-sectional representation of the semiconductor memory device of FIG. 6, depicting the disposition of conductive material within the trenches and in communication with both the contacts and the corresponding exposed regions of their corresponding digit lines.

Referring now to FIG. 7, a layer 36 of conductive material, such as a metal or polysilicon, is disposed over semiconductor memory device 10 so as to substantially fill digit contact openings 18 and communicate with digit contact areas 13 and exposed regions 35 of conductive elements 25 of digit lines 20. Layer 36 may be disposed over semiconductor memory device 10 by known techniques, such as by physical vapor deposition ("PVD") (e.g., sputtering), chemical vapor deposition ("CVD"), or high density plasma ("HDP") deposition processes.

Figure 8:
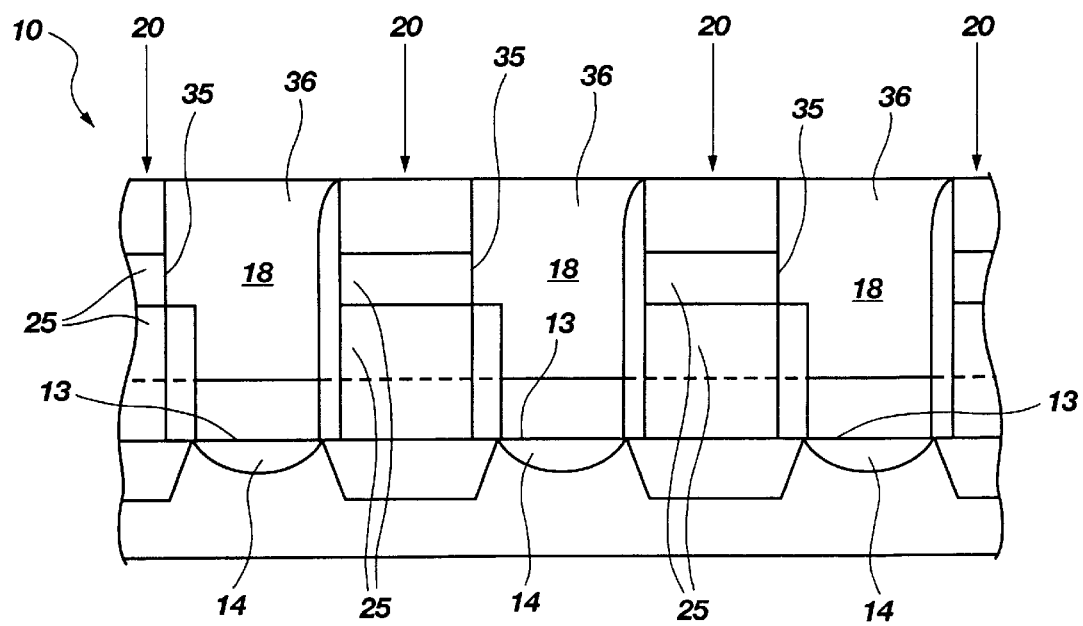
FIG. 8 is a cross-sectional representation of the semiconductor memory device of FIG. 7, depicting the planarization or etch-back of the layer of conductive material.

Turning to FIG. 8, the uppermost portions of layer 36 may be removed in order to expose digit lines 20 through layer 36. Digit lines 20 may be exposed through layer 36 by employing known techniques, such as a blanket isotropic etch-back of layer 36 or by planarizing layer 36 (e.g., by chemical-mechanical planarization ("CMP") processes). As the uppermost portions of layer 36 are removed, the remaining portions of layer 36 are preferably confined between adjacent digit lines 20.

With reference to FIG. 9, a mask 40 may be disposed over semiconductor memory device 10 to facilitate patterning of the remaining portions of layer 36 so as to define electrically conductive digit line contact plugs and straps 22 therefrom. Mask 40 preferably includes a plurality of substantially mutually parallel elongated apertures 42 which extend across semiconductor memory device 10 in a direction substantially perpendicular to the direction in which digit lines 20 extend. Accordingly, mask 40 has a striped configuration. Apertures 42 are alignable substantially between adjacent digit contact openings 18. Accordingly, mask 40 substantially shields regions of layer 36 that are disposed within digit contact openings 18 and in contact with the corresponding exposed regions 35 of digit lines 20. Mask 40 may also have apertures through which regions of semiconductor memory device 10 located laterally between digit contact openings 18 may be exposed to facilitate the fabrication of capacitors in these locations.

Mask 40 may comprise any suitable type of mask known in the art. Preferably, mask 40 is a photomask, which may be formed by disposing photoresist over layer 36, exposing selected regions of the photoresist, and developing the selected regions to define mask 40 and the apertures 42 therethrough.

Regions of layer 36 that are exposed through apertures 42 of mask 40 may be selectively removed by known processes, such as by the use of etchants that will remove the conductive material of these exposed regions. As layer 36 is patterned through mask 40, conductive straps 22 are defined. Adjacent conductive straps 22 are substantially electrically isolated from one another. Mask 40 may then be removed and semiconductor memory device 10 washed by known processes.

Figure 9A:
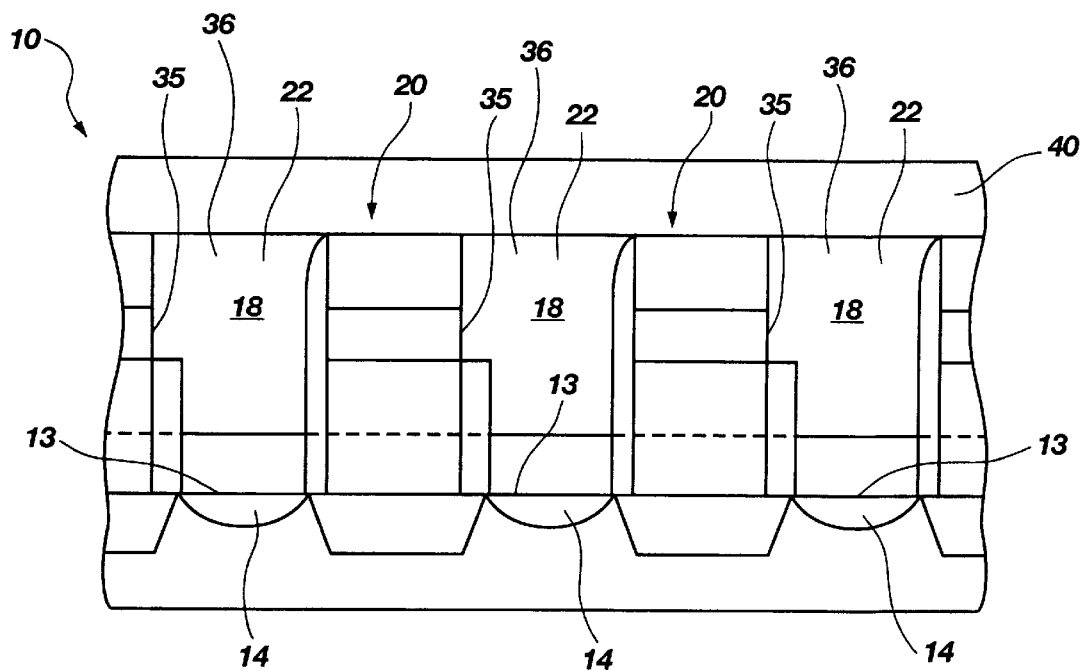
FIG. 9A is a cross-sectional representation of the semiconductor memory device of FIG. 8, depicting the disposition of a mask over the layer of conductive material to facilitate patterning thereof.
Figure 9B:
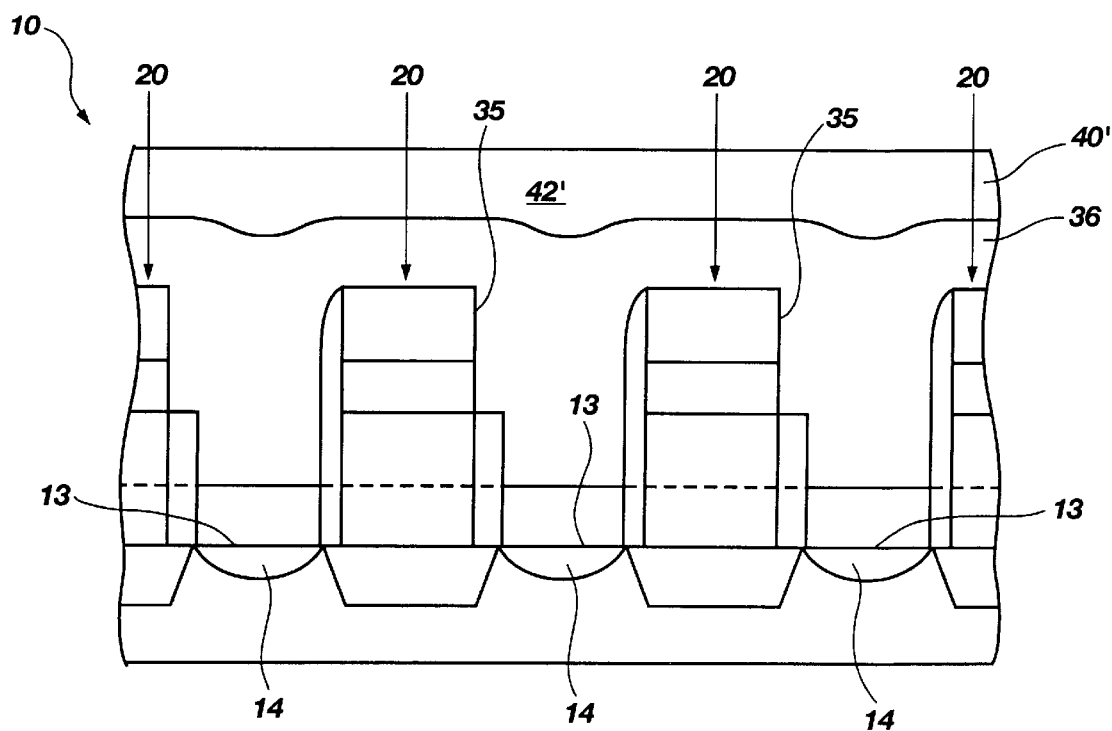
FIG. 9B is a cross-sectional representation of the semiconductor memory device of FIG. 7, depicting the disposition of a mask substantially over the strap and stud regions of the layer of conductive material to facilitate the definition of conductive straps and studs from the layer of conductive material.

As an alternative to the processes illustrated in FIGS. 8–9A and described in reference thereto, with reference to FIG. 9B, a mask 40', may be disposed over layer 36 so as to shield, or mask, the conductive material disposed within digit contact openings 18 and in contact with exposed regions 35 of digit lines 20. Thus, as layer 36 is patterned through mask 40', such as by the use of known etchants that will remove conductive material exposed through the apertures 42' of mask 40', conductive straps 22 that electrically link digit contact areas 13 to their corresponding digit lines 20 are defined and adjacent conductive straps 22 are substantially electrically isolated from one another.

Figure 10:
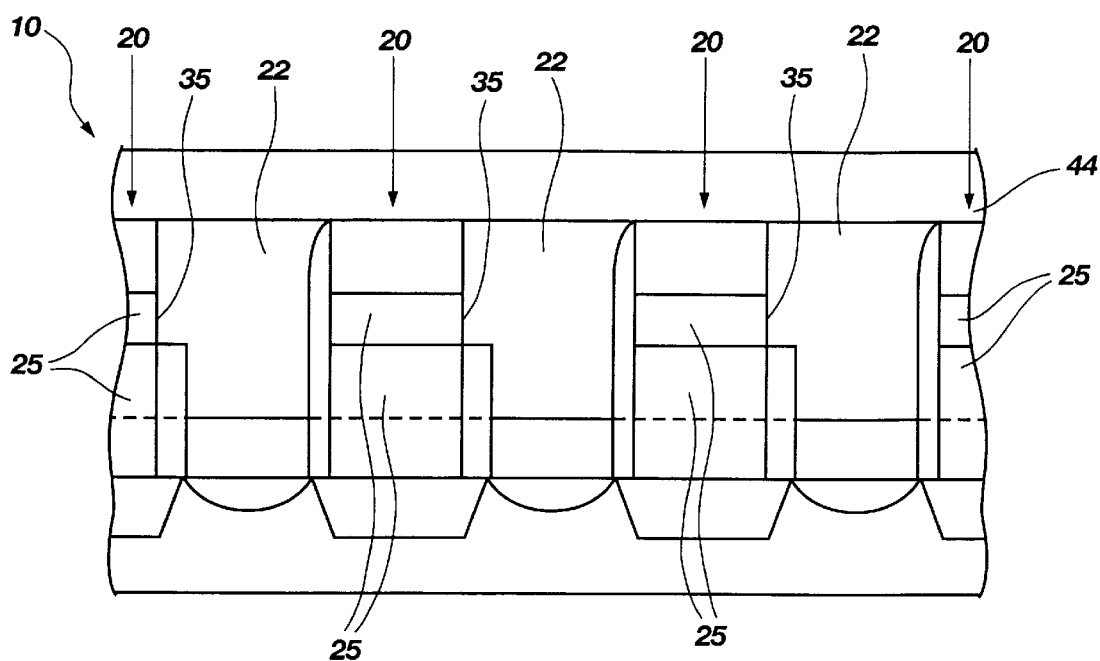
FIG. 10 is a cross-sectional representation of the semiconductor memory device of FIG. 9, illustrating the disposition of insulative material over the surface of the semiconductor memory device.

Referring now to FIG. 10, as conductive straps 22 and conductive elements 25 of digit lines 20 may be exposed following the fabrication of conductive straps 22, a layer 44 of insulative material may be disposed over semiconductor memory device 10 so as to insulate these conductive structures. Layer 44 may be disposed over semiconductor memory device by known processes, such as by known tetraethylorthosilicate ("TEOS") deposition and wet-dipping processes or by known glass (e.g., borophosphosilicate glass ("BPSG"), phosphosilicate glass ("PSG"), or borosilicate glass ("BSG")) deposition techniques, such as chemical vapor deposition or spin-on-glass ("SOG") processes. Other structures may also be fabricated on semiconductor memory device 10 over digit lines 20 and conductive straps 22, as known in the art.

Alternatively, subsequent semiconductor device fabrication processes may be employed as known in the art to complete the fabrication of semiconductor memory device 10.

Although the method of the present invention is disclosed in the context of a semiconductor memory device and semiconductor memory devices are illustrated and disclosed herein, the method may be used to fabricate other types of semiconductor devices, including, without limitation, processors. Accordingly use of the methods of the present invention to fabricate other types of semiconductor devices, as well as other types of semiconductor devices fabricated in accordance with the methods of the present invention or having inventive features disclosed herein, are within the scope of the present invention.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method of fabricating a conductive strap between a bit contact and a digit line of a semiconductor device, comprising:

disposing a mask including at least one aperture therethrough over the semiconductor device such that at least one region of the digit line proximate the bit contact is exposed through said at least one aperture and other regions of the digit line are substantially shielded by said mask;

directing a dopant toward the semiconductor device at an angle non-perpendicular to a plane of the semiconductor device so as to form at least one doped oxide region of an oxide layer of the exposed region of the digit line; and removing said at least one doped oxide region to expose at least one connect region of a conductive element of the digit line.

2. The method of claim 1, wherein said disposing said mask comprises:

disposing a photoresist over a surface of the semiconductor device;

exposing selected regions of the photoresist; and developing said selected regions to define said mask.

3. The method of claim 1, wherein said directing said dopant comprises directing arsenic or phosphorus toward the semiconductor device.

4. The method of claim 1, wherein said directing said dopant at said angle comprises doping at least one select region of a sidewall oxide of the digit line exposed through said mask.

5. The method of claim 1, wherein said directing said dopant at said angle comprises doping at least one region of a substantially corresponding sidewall oxide exposed through said mask and within a path of said dopant.

6. The method of claim 1, wherein said removing said at least one doped oxide region comprises etching said at least one doped oxide region with an etchant selective for doped oxide over undoped oxide.

7. The method of claim 1, further comprising disposing a conductive material in communication with said at least one connect region of said conductive element.

8. The method of claim 7, wherein said disposing said conductive material comprises disposing polysilicon.

9. The method of claim 7, wherein said disposing said conductive material further comprises disposing said conductive material in contact with the bit contact.

10. The method of claim 7, further comprising patterning said conductive material.

11. The method of claim 10, wherein said patterning comprises disposing a mask over said conductive material and selectively removing said conductive material through said mask to define the conductive strap.

12. The method of claim 11, wherein said disposing said mask comprises:

disposing photoresist over said conductive material;

exposing selected regions of said photoresist; and
developing said selected regions.

13. The method of claim 11, wherein said disposing said mask comprises shielding regions of said conductive material disposed over the bit contact and in communication with said at least one connect region of said conductive element and exposing other regions of said conductive material.

14. The method of claim 11, wherein said disposing said mask comprises exposing regions of said conductive material disposed between adjacent bit contacts.

15. The method of claim 11, wherein said selectively removing said conductive material comprises etching regions of said conductive material exposed through said mask.

16. The method of claim 10, wherein said patterning said conductive material comprises defining the conductive strap.

17. The method of claim 16, wherein said patterning said conductive material comprises electrically isolating the conductive strap from an adjacent conductive strap.

18. The method of claim 10, further comprising disposing insulative material over the semiconductor device.

19. A method of fabricating a conductive strap between a bit contact and a digit line of a semiconductor device, comprising:
    shielding regions of the digit line that extend between adjacent bit contacts;
    directing a dopant toward an exposed region of the digit line, located proximate the bit contact, so as to dope a sidewall oxide of the digit line within said selected region to form a doped sidewall region;
    removing said doped sidewall region to expose a connect region of a conductive element of the digit line; and
    disposing conductive material in contact with the bit contact and with said connect region.

20. The method of claim 19, wherein said shielding comprises disposing a mask over the semiconductor device.

21. The method of claim 20, wherein said disposing said mask comprises aligning elongate apertures of said mask transversely relative to the digit line and over the bit contact.

22. The method of claim 19, wherein said directing said dopant comprises directing arsenic or phosphorus toward said selected region.

23. The method of claim 19, wherein said directing said dopant comprises directing said dopant at an angle non-perpendicular to a plane of the semiconductor device.

24. The method of claim 23, wherein said directing said dopant at said angle comprises doping said sidewall oxide within said selected region without doping another sidewall insulator disposed adjacent an opposite side of the digit line.

25. The method of claim 19, wherein said removing comprises etching said doped sidewall region.

26. The method of claim 25, wherein said etching comprises exposing the semiconductor device to an etchant with selectivity for a doped oxide over an undoped oxide.

27. The method of claim 19, wherein said disposing said conductive material comprises disposing polysilicon.

28. The method of claim 19, wherein said disposing said conductive material comprises disposing conductive material in contact with the contact and with said connect region.

29. The method of claim 19, further comprising patterning said conductive material.

30. The method of claim 29, wherein said patterning said conductive material comprises defining the conductive strap.

31. The method of claim 29, wherein said patterning comprises disposing a mask over said conductive material and selectively removing said conductive material through said mask to define the conductive strap.

32. The method of claim 31, wherein said disposing said mask comprises:
    disposing photoresist over said conductive material;
    exposing selected regions of said photoresist; and
    developing said selected regions.

33. The method of claim 31, wherein said disposing said mask comprises shielding regions of said conductive material disposed over the bit contact and in communication with said connect region of said conductive element.

34. The method of claim 31, wherein said disposing said mask comprises exposing regions of said conductive material disposed between adjacent bit contacts.

35. The method of claim 31, wherein said selectively removing said conductive material comprises etching regions of said conductive material exposed through said mask.

36. The method of claim 30, wherein said patterning said conductive material comprises defining the conductive strap.

37. The method of claim 36, wherein said patterning said conductive material comprises electrically isolating the conductive strap from an adjacent conductive strap.

38. The method of claim 30, further comprising disposing insulative material over the semiconductor device.

39. A semiconductor device, comprising:
    at least one word line;
    at least one bit contact adjacent said at least one word line; and
    at least two substantially mutually parallel digit lines extending transversely relative to said at least one word line, said bit contact laterally disposed between adjacent ones of said at least two digit lines, said adjacent ones spaced less than about 0.2 microns apart from one another, a first digit line of said adjacent ones including a sidewall oxide with a connect region of a first conductive element of said first digit line exposed through a selected region thereof, and a second digit line of said adjacent ones including an opposing sidewall insulator facing said sidewall oxide and substantially insulating a lateral side of a second conductive element of said second digit line.

40. The semiconductor device of claim 39, wherein said first digit line and said second digit line are spaced at most about 0.2 microns apart.

41. The semiconductor device of claim 39, wherein said first digit line and said second digit line are spaced about 0.2 microns from one another.

42. The semiconductor device of claim 39, further comprising a quantity of conductive material disposed between said at least one bit contact and said connect region.

43. The semiconductor device of claim 42, wherein said quantity of conductive material comprises polysilicon.

44. The semiconductor device of claim 42, wherein said quantity of conductive material comprises a conductive strap.

45. The semiconductor device of claim 44, wherein said conductive strap electrically interconnects said at least one bit contact with said connect region.

46. The semiconductor device of claim 39, wherein said sidewall oxide and said opposing sidewall insulator are substantially free of dopant.

47. The semiconductor device of claim 43, further comprising a layer of insulative material disposed substantially over said at least two digit lines.

48. A semiconductor device, comprising:
    a plurality of substantially mutually parallel word lines;
    bit contacts disposed between adjacent ones of said plurality of word lines;

a plurality of substantially mutually parallel digit lines disposed transversely relative to said plurality of word lines, said bit contacts disposed between adjacent ones of said plurality of digit lines, each of said plurality of digit lines having a width of less than about 0.2 microns;

first sidewall insulators disposed adjacent a first side of each of selected ones of said plurality of digit lines; and second sidewall oxides disposed adjacent a second side of each of selected ones of said plurality of digit lines and including a doped region proximate one of said bit contacts.

49. The semiconductor device of claim 48, wherein each of said plurality of digit lines has a width of at most about 0.2 microns.

50. The semiconductor device of claim 48, wherein each of said plurality of digit lines has a width of about 0.2 microns.

51. The semiconductor device of claim 48, wherein adjacent ones of said digit lines are spaced less than about 0.2 microns apart.

52. The semiconductor device of claim 48, wherein adjacent ones of said digit lines are spaced at most about 0.2 microns apart.

53. The semiconductor device of claim 48, wherein each of said plurality of digit lines comprises an insulative cap.

54. The semiconductor device of claim 53, wherein said insulative cap comprises silicon oxide.

55. The semiconductor device of claim 54, wherein said insulative cap comprises at least one doped silicon oxide region.

56. The semiconductor device of claim 55, wherein said at least one doped silicon oxide region is adjacent a trench through which a corresponding one of said bit contacts is exposed.

57. The semiconductor device of claim 55, wherein said doped silicon oxide region is substantially contiguous with said doped region of said first sidewall oxide.

58. The semiconductor device of claim 53, wherein said insulative cap comprises silicon nitride.

* * * * *

UNITED STATES PATENT AND TRADEMARK OFFICE
CERTIFICATE OF CORRECTION

PATENT NO. : 6,329,686 B1  Page 1 of 3
DATED : December 11, 2001
INVENTOR(S) : Tyler A. Lowrey and Shubneesh Batra It is certified that error appears in the above-identified patent and that said Letters Patent is hereby corrected as shown below:

Title page, Item [54] and Column 1, line 4,
Title, change "SIDEWALL" to -- SIDE WALL --

Title page,
Item [57], ABSTRACT,
Lines 13, 14, 16 and 18, change "sidewall" to -- side wall --

Drawings,
Figure 9A, insert -- 42 -- indicating the position of the apertures within the mask 40.
Please replace FIG. 9A with the following:

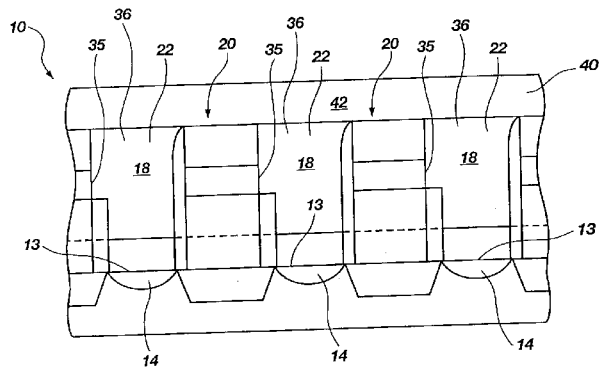

Fig. 9A

Column 2,
Lines 65 and 67, change "sidewall" to -- side wall --

Column 3,
Line 19, change "sidewall" to -- side wall --

Column 4,
Line 14, change "sidewall" to -- side wall --

Column 5,
Lines 14, 33, 37, 38, 44 and 46, change "sidewall" to -- side wall --

UNITED STATES PATENT AND TRADEMARK OFFICE
CERTIFICATE OF CORRECTION

PATENT NO.    : 6,329,686 B1
DATED         : December 11, 2001
INVENTOR(S)   : Tyler A. Lowrey and Shubneesh Batra It is certified that error appears in the above-identified patent and that said Letters Patent is hereby corrected as shown below:

Column 6,
Lines 4, 14 and 36, change "sidewall" to -- side wall --
Line 12, change "sidewall" (both occurrences) to -- side wall --
Line 18, after "34" insert -- (FIG. 5) -- and change "sidewall" to -- side wall --
Line 25, change "sidewall" (both occurrences) to -- side wall --
Line 57, change "9" to -- 9A --

Column 7,
Line 32, after "22" insert -- (FIG. 10) --
Line 42, after "device" and before "by" insert -- 10 --
Line 60, insert a comma after "Accordingly"

Column 8,
Lines 41 and 45, change "sidewall" to -- side wall --

Column 9,
Line 29, change "sidewall" to -- side wall -- and change "selected" to -- exposed --
Lines 30, 31, 47 and 51, change "sidewall" to -- side wall --
Line 42, change "selected" to -- exposed --
Line 48, change "selected" to -- exposed -- and change "sidewall" to -- side wall --
Line 59, after "the" and before "contact" insert -- bit --

Column 10,
Line 30, after "said" and before "bit" insert -- at least one --
Line 31, after "two" and before "digit" insert -- substantially mutually parallel --
Lines 34 and 38, change "sidewall" to -- side wall --
Lines 37-38, delete the hyphen at the end of the line
Line 59, change "sidewall" (both occurrences) to -- side wall --
Line 63, after "two" and before "digit" insert -- substantially mutually parallel --
Line 67, after "of" and before "word" insert -- substantially mutually parallel --

Column 11,
Line 2, after "of" and before "word" insert -- substantially mutually parallel --
Lines 4, 10, 14 and 17, after "of" and before "digit" insert -- substantially mutually parallel --
Line 5, before "digit" insert -- substantially mutually parallel --
Line 7, change "sidewall" to -- side wall --
Line 20, after "said" and before "digit" insert -- plurality of substantially mutually parallel --

UNITED STATES PATENT AND TRADEMARK OFFICE
CERTIFICATE OF CORRECTION

PATENT NO. : 6,329,686 B1
DATED : December 11, 2001
INVENTOR(S) : Tyler A. Lowrey and Shubneesh Batra It is certified that error appears in the above-identified patent and that said Letters Patent is hereby corrected as shown below:

Column 12,
Line 2, after "said" and before "digit" insert -- plurality of substantially mutually parallel --
Line 5, after "of" and before "digit" insert -- substantially mutually parallel --
Line 16, before "doped" insert -- at least one --
Line 17, change "first sidewall" to -- second side wall --

Signed and Sealed this

Twenty-seventh Day of January, 2004

JON W. DUDAS
*Acting Director of the United States Patent and Trademark Office*